United States Patent
Horio et al.

(10) Patent No.: US 8,766,732 B2
(45) Date of Patent: Jul. 1, 2014

(54) MULTI-SCREW CHAOTIC OSCILLATOR CIRCUIT

(75) Inventors: Yoshihiko Horio, Warabi (JP); Takuya Hamada, Iruma (JP); Kenya Jinno, Yokohama (JP); Kazuyuki Aihara, Narashino (JP)

(73) Assignee: Japan Science and Technology Agency, Saitama (JP)

( * ) Notice: Subject to any disclaimer, the term of this patent is extended or adjusted under 35 U.S.C. 154(b) by 0 days.

(21) Appl. No.: 13/259,553

(22) PCT Filed: Mar. 10, 2010

(86) PCT No.: PCT/JP2010/001687
§ 371 (c)(1),
(2), (4) Date: Oct. 6, 2011

(87) PCT Pub. No.: WO2010/109793
PCT Pub. Date: Sep. 30, 2010

(65) Prior Publication Data
US 2012/0019330 A1 Jan. 26, 2012

(30) Foreign Application Priority Data

Mar. 24, 2009 (JP) ................................. 2009-071195

(51) Int. Cl.
*H03K 3/84* (2006.01)
(52) U.S. Cl.
USPC .............. 331/78; 323/299; 380/259; 380/263
(58) Field of Classification Search
USPC ....................... 331/78; 323/299; 380/259, 263
See application file for complete search history.

(56) References Cited

PUBLICATIONS

Kenya Jin'no et al., "A Multi-Hysteresis VCCS and Its Application to Multi-Schroll Chaotic Oscillators", Proceedings of the IEEE International Symposium on Circuits and Systems, 2009, pp. 2850-2853.
R. W. Newcomb et al., "An RC Op Amp Chaos Generator", IEEE Transactions on Circuits and Systems, vol. 30, No. 1, Jan. 1983, pp. 54-56.
Robert W. Newcomb et al., "A Binary Hysteresis Chaos Generator", in Proceedings of 1984 IEEE Int'l Symposium on Circuits and Systems, 1984, pp. 856-859.
Toshimichi Saito, "On a Hysteresis Chaos Generator", in Proceedings of 1985 IEEE Int'l Symposium on Circuits and Systems, 1985, pp. 847-849.
Takashi Suzuki et al., "On Fundamental Bifurcations from a Hysteresis Hyperchaos Generator", IEEE Transactions on Circuits and Systems, Part I, Fundamental Theory and Applications, vol. 41, No. 12, Dec. 1994, pp. 876-884.
Toshimichi Saito et al., "Chaos from a Hysteresis and Switched Circuit", Philosophical Transactions: Physical Sciences and Engineering, vol. 353, No. 1701, 1995, pp. 47-57.

(Continued)

*Primary Examiner* — Arnold Kinkead
(74) *Attorney, Agent, or Firm* — Bacon & Thomas, PLLC

(57) ABSTRACT

There is provided a multi-screw chaotic oscillator circuit with simple configuration, that can use various multi-hysteresis VCCS characteristics and generate a variety of multi-screw attractors. The multi-screw chaotic oscillator circuit comprises: a linear two-port VCCS circuit 1 consisting of a set of linear VCCS circuits $G_1$ and $G_2$; a multi-hysteresis two-port VCCS circuit 2 consisting of a set of multi-hysteresis VCCS circuits $MH_1$ and $MH_2$ having multi-hysteresis characteristic; and capacitors $C_1$ and $C_2$ connected to each end of a circuit configured by parallel-connecting the linear two-port VCCS circuit 1 and the multi-hysteresis two-port VCCS circuit 2.

9 Claims, 13 Drawing Sheets

(56) References Cited

PUBLICATIONS

Toshimichi Saito et al., "Control of Chaos from a Piecewise Linear Hysteresis Circuit", IEEE Transactions on Circuits and Systems, Part I, Fundamental Theory and Applications, vol. 42, No. 3, Mar. 1995, pp. 168-172.

Joseph E. Varrientos et al., "A 4-D Chaotic Oscillator Based on a Differential Hysteresis Comparator", IEEE Transactions on Circuits and Systems, Part I, Fundamental Theory and Applications, vol. 45, No. 1, Jan. 1998, pp. 3-10.

Ahmed S. Elwakil et al., "Chaotic Oscillators Derived from Saito's Double-Screw Hysteresis Oscillator", IEICE Trans. Fundamentals, vol. E82-A, No. 9, Sep. 1999, pp. 1769-1775.

Masaki Kataoka et al., "A Two-Port VCCS Chaotic Oscillator and Quad Screw Attractor", IEEE Transactions on Circuits and Systems, Part I, Fundamental Theory and Applications, vol. 48, No. 2, Feb. 2001, pp. 221-225.

Federico Bizzarri et al., "Bifurcation Analysis and Its Experimental Validation for a Hysteresis Circuit Oscillator", IEEE Transactions on Circuits and Systems, Part II, Express Briefs, vol. 53, No. 7, Jul. 2006, pp. 517-521.

Fengling Han et al., "n-scroll chaotic oscillators by second-order systems and double-hysteresis blocks", Electronic Letters, vol. 39, No. 23, Nov. 13, 2003, pp. 1636-1637.

Fengling Han et al., "A New Way of Generating Grid-Scroll Chaos and its Application to Biometric Authentication", in Proceedings of IEEE 2005 Industrial Electronics Society, 31st Annual Conference, 2005, pp. 61-66.

Fengling Han et al., "On Multiscroll Chaotic Attractors in Hysteresis-Based Piecewise-Linear Systems", IEEE Transactions on Circuits and Systems, Part II, Express Briefs, vol. 54, No. 11, Nov. 2007, pp. 1004-1008.

Takuya Hamada et al., "An IC Implementation of a Hysteresis Two-Port VCCS Chaotic Oscillator", in Proceedings of European Conf. on Circuits Theory and Design, 2007, pp. 926-929.

Takuya Hamada et al., "Experimental Observations from an Integrated Hysteresis Two-Port VCCS Chaotic Oscillator", in Proceedings IEEE Int'l Workshop on Nonlinear Dynamics of Electronic Systems, 2007, pp. 237-240.

Takuya Hamada et al., "A Fully-Differential Hysteresis Two-Port VCCS Chaotic Oscillator", IEICE Technical report, NLP2007-180, 2008, pp. 79-84.

Kiyomitsu Ogata et al., "Chaotic Attractors in a 4-D Oscillator Based on 2-Port VCCSs", Proceedings IEEE International Symposium on Circuits and Syst., vol. 2, 2002, pp. 556-559.

Masaki Kataoka et al., "A Chaotic Oscillator Based on Two-Port VCCS", in Chaos in Circuits and Systems, G. Chen and T. Ueda eds., 2002, Singapore, pp. 131-143.

Masaki Kataoka et al., "A 4-D Chaotic Oscillator with a Hysteresis 2-Port VCCS: The First Example of Chaotic Oscillators Consisting of 2-Port VCCSs and Capacitors", Proceedings IEEE International Symposium on Circuits and Syst., 1999, vol. 5, pp. 418-421.

FIG. 1
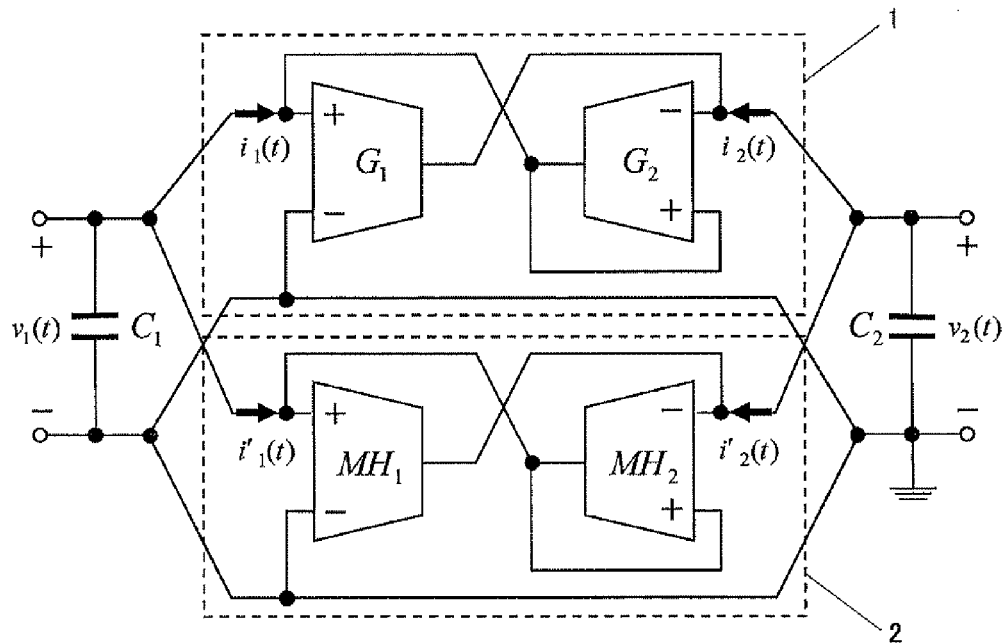
FIG. 2
(a)  (b)
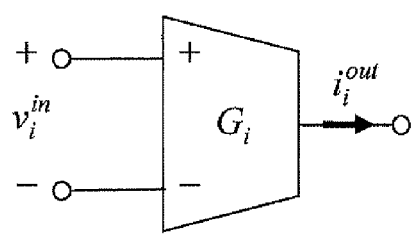
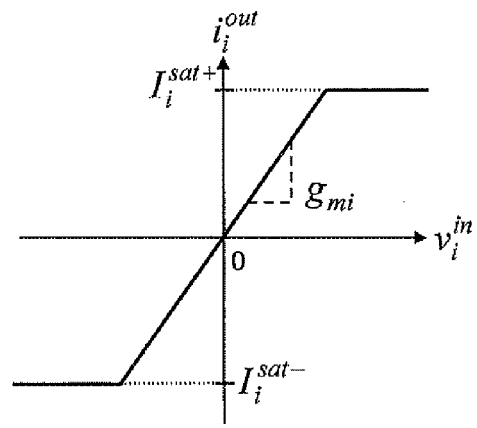
FIG. 3
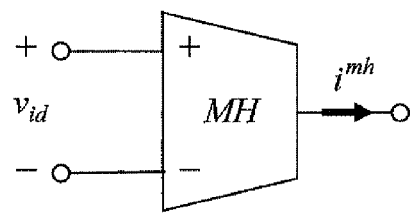

FIG. 8
(a)
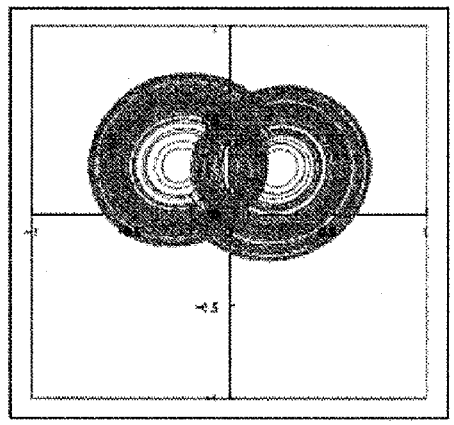
(b)
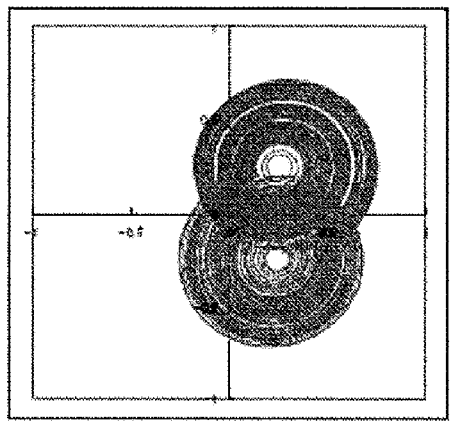
(c)
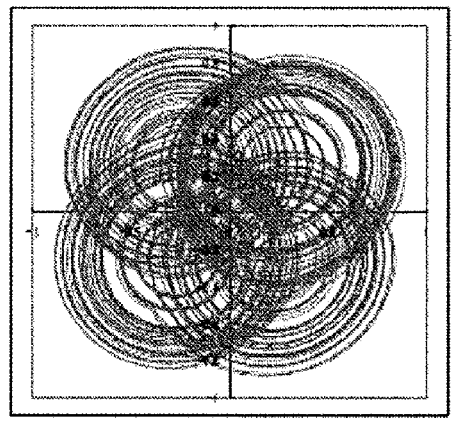
(d)
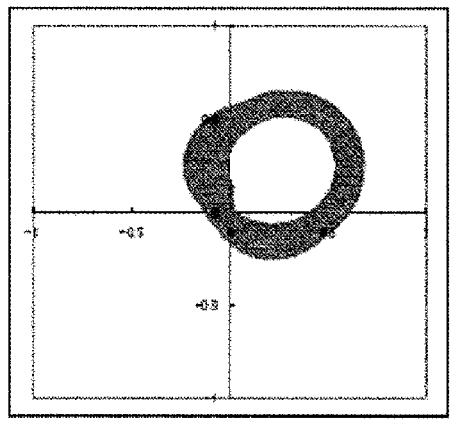

FIG. 17
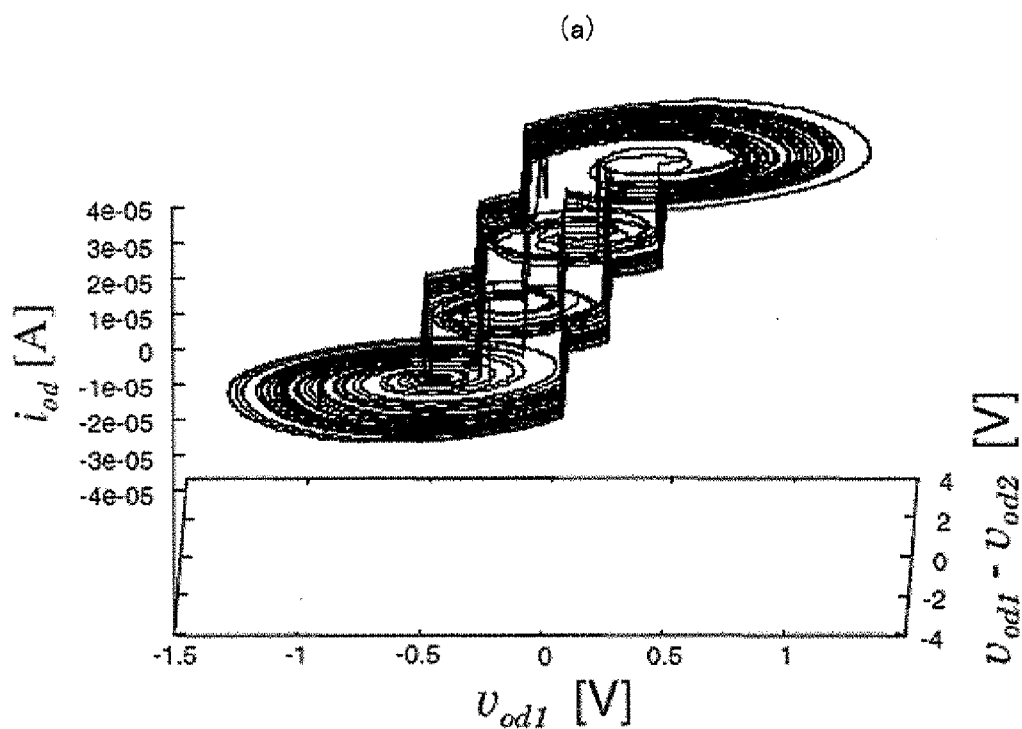
(a)
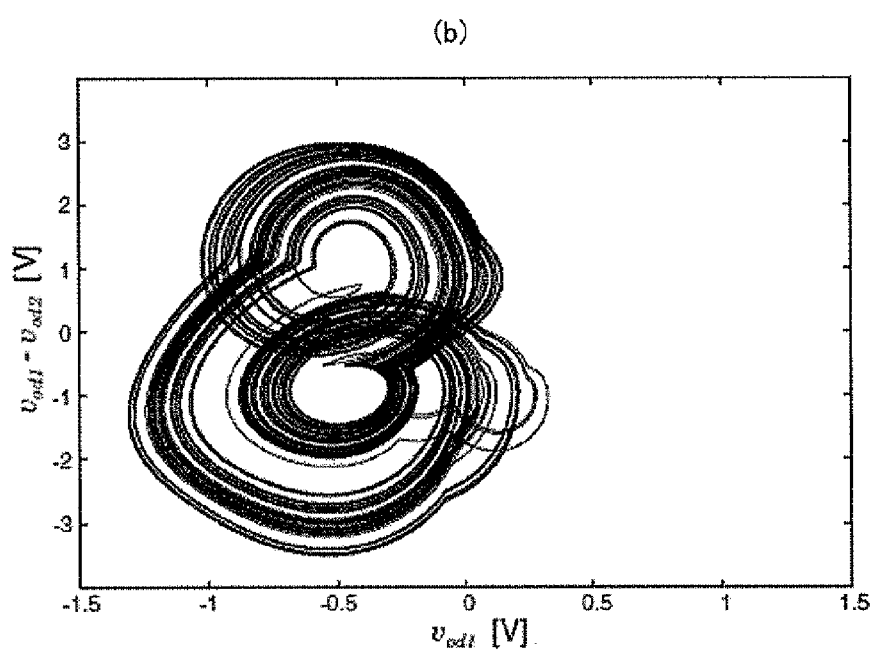
(b)

FIG. 18
(a)
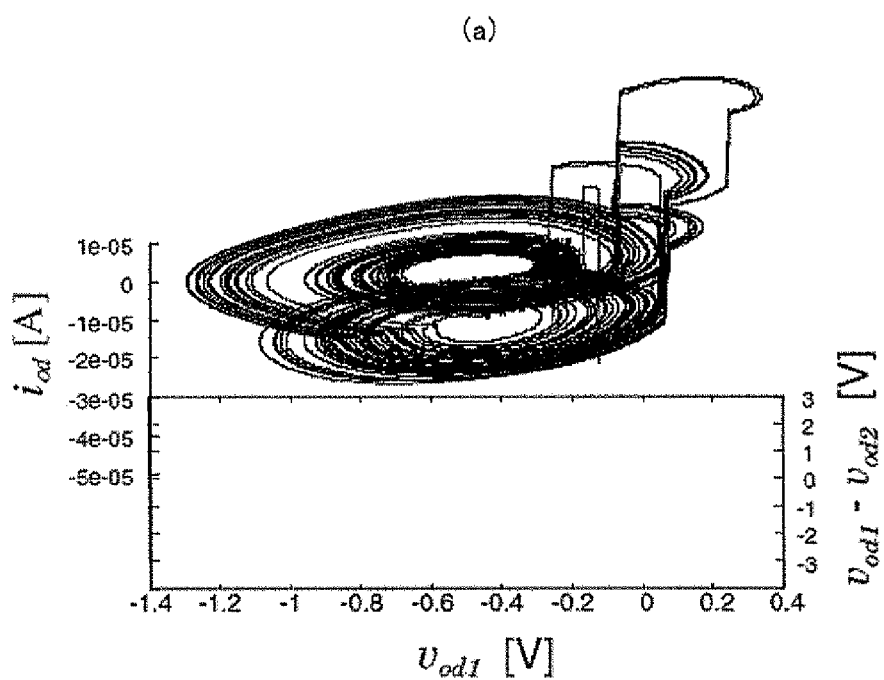
(b)
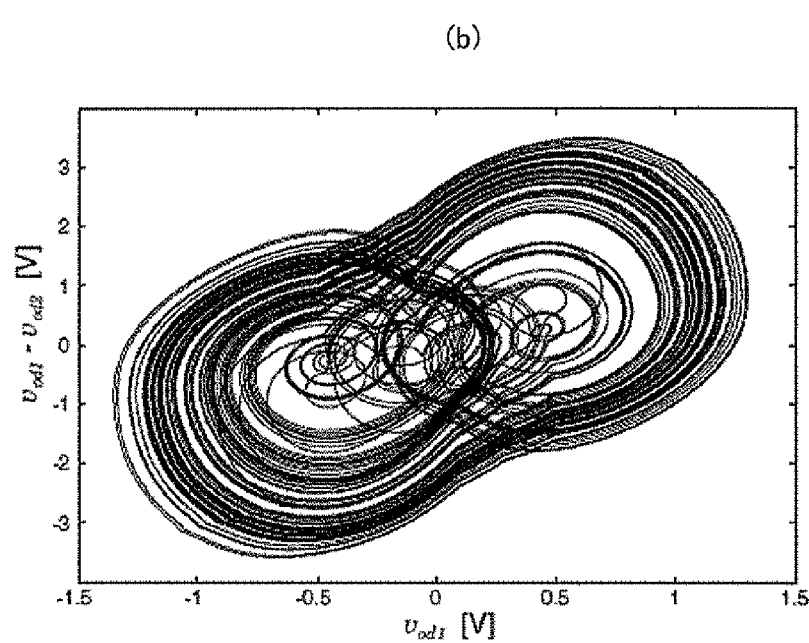

US 8,766,732 B2

MULTI-SCREW CHAOTIC OSCILLATOR CIRCUIT

BACKGROUND OF THE INVENTION

1. Field of the Invention

The present invention relates to a multi-screw chaotic oscillator circuit, and particularly, to a multi-screw chaotic oscillator circuit suitable for the quick physical simulations of high-dimensional hybrid dynamical systems or for the information processing systems based on high-dimensional hybrid dynamics.

2. Description of Related Art

Conventionally, the chaos generating circuits using piecewise linear single-hysteresis elements have been proposed (see Non-Patent Documents 1-13 below), and it has been reported that a variety of interesting chaotic attractors can be observed. The method has also been proposed wherein the single-hysteresis elements as components are replaced by multi-hysteresis elements that can produce multivalued outputs (see Non-Patent Documents 14-16 below). In this method, grid-scroll attractors or the like can be observed, that have not been generated in conventional chaotic circuits using single-hysteresis characteristics.

Patent Document 1: JP 2009-025790

Non-Patent Document 1: R. W. Newcomb, and S. Sathyan, "An RC op amp chaos generator", IEEE Trans. on Circuits and Systems, Part I, Fundam. Theory Appl., vol. 30, no. 1, pp. 54-56, 1983

Non-Patent Document 2: R. W. Newcomb, and N. El-Leithy, "A binary hysteresis chaos generator", in Proc. of 1984 IEEE Int'l Symp. on Circuits and Systems, pp. 856-859, 1984

Non-Patent Document 3: Toshimichi Saito, "On a hysteresis chaos generator", in Proc. of 1985 IEEE Int'l Symp. on Circuits and Systems, pp. 847-849, 1985

Non-Patent Document 4: Takashi Suzuki, and Toshimichi Saito, "On fundamental bifurcations from a hysteresis hyperchaos generator", IEEE Trans. on Circuits and Systems, Part I, Fundam. Theory Appl., vol. 41, no. 12, pp. 876-884, 1994

Non-Patent Document 5: Toshimichi Saito, and Shinji Nakagawa, "Chaos from a hysteresis and switched circuit", Phil. Trans. R. Soc. Lond. A, vol. 353, no. 1701, pp. 47-57, 1995

Non-Patent Document 6: Toshimichi Saito, and Kunihiko Mitsubori, "Control of chaos from a piecewise linear hysteresis circuit", IEEE Trans. on Circuits and Systems, Part I, Fundam. Theory Appl., vol. 42, no. 3, pp. 168-172, 1995

Non-Patent Document 7: J. E. Varrientos, and E. Sanchez-Sinencio, "A 4-D chaotic oscillator based on a differential hysteresis comparator", IEEE Trans. on Circuits and Systems, Part I, Fundam. Theory Appl., vol. 45, no. 1, pp. 3-10, 1998

Non-Patent Document 8: A. S. Elwakil, and M. P. Kennedy, "Chaotic oscillators derived from Saito's double-screw hysteresis oscillator", IEICE Trans. Fundamentals, vol. E82-A, no. 9, pp. 1769-1775, 1999

Non-Patent Document 9: F. Bizzarri, D. Stellardo, and M. Storace, "Bifurcation analysis and its experimental validation for a hysteresis circuit oscillator", IEEE Trans. on Circuits and Systems, Part I. Regular Papers, vol. 53, no. 7, pp. 517-521, 2006

Non-Patent Document 10: Masaki Kataoka and Toshimichi Saito, "A 4-D chaotic oscillator with a hysteresis 2-port VCCS: The first example of chaotic oscillators consisting of 2-port VCCSs and capacitors", in Proc. IEEE Intl Symp. on Circuits and Syst., vol. 5, pp. 418-421, 1999

Non-Patent Document 11: Masaki Kataoka and Toshimichi Saito, "A 2-port VCCS chaotic oscillator and quad screw attractor", IEEE Trans. on Circuits and Systems, Part I, Fundam. Theory Appi., vol. 48, no. 2, pp. 221-225, 2001

Non-Patent Document 12: Masaki Katoka and Toshimichi Saito, "A chaotic oscillator based on two-port VCCS", in Chaos in Circuits and Systems, G. Chen and T. Ueda eds., pp. 131-143, World Scientific, Singapore, 2002

Non-Patent Document 13: Kiyomitsu Ogata and Toshimichi Saito, "Chaotic attractors in a 4-D oscillator based on 2-port VCCSs", in Proc. IEEE Intl Symp. on Circuits and Syst., vol. 2, pp. 556-559, 2002

Non-Patent Document 14: Fengling Han, Xinghuo Yu, Yuye Wang, Yong Feng, and Guanrong Chen, "n-scroll chaotic oscillators by second-order systems and double-hysteresis blocks", Electronics Letters, vol. 39, no. 23, pp. 1636-1637, 2003

Non-Patent Document 15: Fengling Han, Xinghuo Yu, and Jiankun Hu, "A new way of generating grid-scroll chaos and its application to biometric authentication", in Proc. of IEEE 2005 Industrial Electronics Society, 31st Annual Conference, pp. 61-66, 2005

Non-Patent Document 16: Fengling Han, Xinghuo Yu, Yong Feng, and Jiankun Hu, "On multiscroll chaotic attractors in hysteresis-based piecewise-linear systems", IEEE Trans. on Circuits and Systems, Part II, and Express Briefs, vol. 54, no. 11, pp. 1004-1008, 2007

Non-Patent Document 17: Takuya Hamada, Yoshihiko Horio, and Kazuyuki Aihara, "An IC implementation of a hysteresis two-port VCCS chaotic oscillator", in Proc. of European Conf. on Circuits Theory and Design, pp. 926-929, 2007

Non-Patent Document 18: Takuya Hamada, Yoshihiko Horio, and Kazuyuki Aihara, "Experimental observations from an integrated hysteresis two-port VCCS chaotic oscillator", in Proc. IEEE Int'l Work-shop on Nonlinear Dynamics of Electronic Systems, pp. 237-240, 2007

Non-Patent Document 19: Takuya Hamada, Yoshihiko Horio, and Kazuyuki Aihara, "A Fully-Differential Hysteresis Two-Port VCCS Chaotic Oscillator", IEICE Technical Report, NLP2007-180, pp. 79-84, 2008

SUMMARY OF THE INVENTION

However, the multi-hysteresis characteristics proposed in the above-mentioned Non-Patent Documents 14-16 only present the shapes where the single-hysteresis characteristics are combined in series, and thus chaotic attractors to be generated necessarily depend thereon. In addition, the multi-hysteresis characteristic used therein is constituted by connecting a plurality of voltage controlled voltage source circuits (VCVS circuits) having the single-hysteresis characteristics. Since inputs and outputs of such VCVS circuits are both voltages, there has been a disadvantage that connecting a plurality of circuits requires an adder, resulting in the increase in scale of the circuits.

In view of the circumstances described above, the present invention is directed to provide a multi-screw chaotic oscillator circuit with simple configuration, that can use various multi-hysteresis VCCS characteristics and generate a variety of multi-screw attractors.

This multi-screw chaotic oscillator circuit is intended to provide the multi-screw chaotic oscillator circuit in taking into account the chaos generating circuit using the single-hysteresis voltage controlled voltage source circuit (VCCS circuit) (Non-Patent Documents 10-13) and replacing the single-hysteresis VCCS circuit in the chaos generating circuit with the multi-hysteresis VCCS circuit.

The multi-hysteresis VCCS circuit used herein can be realized easily with the method of realizing multi-hysteresis characteristics utilizing the feature that the VCCS circuit is a current output type (Patent Document 1) proposed by the present inventors. Moreover, since this method of realizing multi-hysteresis VCCS characteristics easily allows the utilization of a variety of multi-hysteresis characteristics, novel high-dimensional multi-screw attractors or bifurcation structures can be realized which have not been observed in Non-Patent Documents 10-13.

In order to achieve the object described above, the present invention provides the following:

[1] A multi-screw chaotic oscillator circuit comprising: a linear two-port VCCS circuit consisting of a set of linear VCCS circuits $G_1$ and $G_2$; a multi-hysteresis two-port VCCS circuit consisting of a set of multi-hysteresis VCCS circuits $MH_1$ and $MH_2$ having multi-hysteresis characteristic; and capacitors $C_1$ and $C_2$ connected to each end of a circuit configured by parallel-connecting the linear two-port VCCS circuit and the multi-hysteresis two-port VCCS circuit.

[2] The multi-screw chaotic oscillator circuit according to [1] above, wherein a variety of chaotic attractors or bifurcation structures are realized by using various multi-hysteresis VCCS characteristics as the characteristics of the multi-hysteresis VCCS circuits $MH_1$ and $MH_2$.

[3] The multi-screw chaotic oscillator circuit according to [2] above, wherein a greater number of chaotic attractors or bifurcation phenomena are presented by changing different characteristics of the multi-hysteresis VCCS circuits $MH_1$ and $MH_2$.

[4] The multi-screw chaotic oscillator circuit according to [3] above, wherein the different characteristics of the multi-hysteresis VCCS circuits $MH_1$ and $MH_2$ are thresholds or saturation currents.

[5] The multi-screw chaotic oscillator circuit according to [4] above, wherein the thresholds include a plurality of thresholds having different values from each other.

[6] The multi-screw chaotic oscillator circuit according to [5] above, wherein the multi-hysteresis VCCS circuit $MH_1$ has n values of the saturation current, and the multi-hysteresis VCCS circuit $MH_2$ has m values of the saturation current.

[7] The multi-screw chaotic oscillator circuit according to [6] above, wherein, when the plurality of thresholds express four values, four discrete outputs are present for each of the multi-hysteresis VCCS circuits $MH_1$ and $MH_2$ and 16 half spaces corresponding to the combinations of each of the four discrete outputs are present in a solution space, so that the chaotic attractors are classified based on which half space among them a solution trajectory passes through.

[8] The multi-screw chaotic oscillator circuit according to [2] above, wherein a greater number of chaotic attractors or bifurcation phenomena are presented by changing a plurality of control parameters of the multi-hysteresis VCCS characteristics.

[9] The multi-screw chaotic oscillator circuit according to [8] above, wherein the plurality of control parameters include the shapes of the multi-hysteresis VCCS characteristics and eigenvalues of the circuit.

[10] The multi-screw chaotic oscillator circuit according to [1] above, wherein, when an attenuation parameter delta is 0.05, vibrational angular frequency parameter omega is 1.00, an equilibrium point parameter p is 0.25, and an equilibrium point parameter q is 0.25 of a normalized parameter for the multi-hysteresis two-port VCCS circuit consisting of the set of multi-hysteresis VCCS circuits $MH_1$ and $MH_2$ having the multi-hysteresis VCCS characteristics, the thresholds of the multi-hysteresis VCCS circuits $MH_1$ and $MH_2$ are changed.

[11] The multi-screw chaotic oscillator circuit according to any one of [1] to [10] above, wherein capacities of the capacitors $C_1$ and $C_2$ are 40 pF and 10 pF, respectively.

According to the present invention, the following effects can be achieved.

(1) Since the chaotic oscillator circuit does not include an inductor in spite of the fact that it is a continuous-time circuit, a circuit with simpler configuration can be provided as compared to the conventionally-proposed chaotic circuits.

(2) Since a variety of multi-hysteresis VCCS characteristics can be used, various multi-screw attractors can be generated.

(3) By changing different characteristics of the multi-hysteresis VCCS circuit as a component, a greater number of chaotic attractors or bifurcation structures can be realized.

BRIEF DESCRIPTION OF THE DRAWINGS

FIG. 1 shows a diagram of a multi-screw chaotic oscillator circuit of the present invention;

FIG. 2 shows a characteristic of linear VCCS circuits $G_1$ and $G_2$ in the multi-screw chaotic oscillator circuit of the present invention;

FIG. 3 shows a circuit symbol of multi-hysteresis VCCS circuits $MH_1$ and $MH_2$ in the multi-screw chaotic oscillator circuit of the present invention;

FIG. 8 shows examples of chaotic attractors of the multi-screw chaotic oscillator circuit obtained by changing the thresholds $Th_1$ and $Th_2$ when the normalized multi-hysteresis VCCS characteristic shown in FIG. 6 is used;

FIGS. 17(a) and 17(b), show the chaotic attractor obtained when the characteristic (a) shown in FIG. 16 is used as the characteristic of the multi-hysteresis VCCS circuit $MH_1$;

FIGS. 18(a) and 18(b), show the chaotic attractor obtained when the characteristic (b) shown in FIG. 16 is used as the characteristic of the multi-hysteresis VCCS circuit $MH_1$.

DESCRIPTION OF THE PREFERRED EMBODIMENTS

A multi-screw chaotic oscillator circuit of the present invention comprises: a linear two-port VCCS circuit consisting of a set of linear VCCS circuits $G_1$ and $G_2$; a multi-hysteresis two-port VCCS circuit consisting of a set of multi-hysteresis VCCS circuits $MH_1$ and $MH_2$ having multi-hysteresis characteristic; and capacitors $C_1$ and $C_2$ connected to each end of a circuit configured by parallel-connecting the linear two-port VCCS circuit and the multi-hysteresis two-port VCCS circuit.

Embodiments

Hereinafter, embodiments of the present invention will be described in detail.

Figure 4:
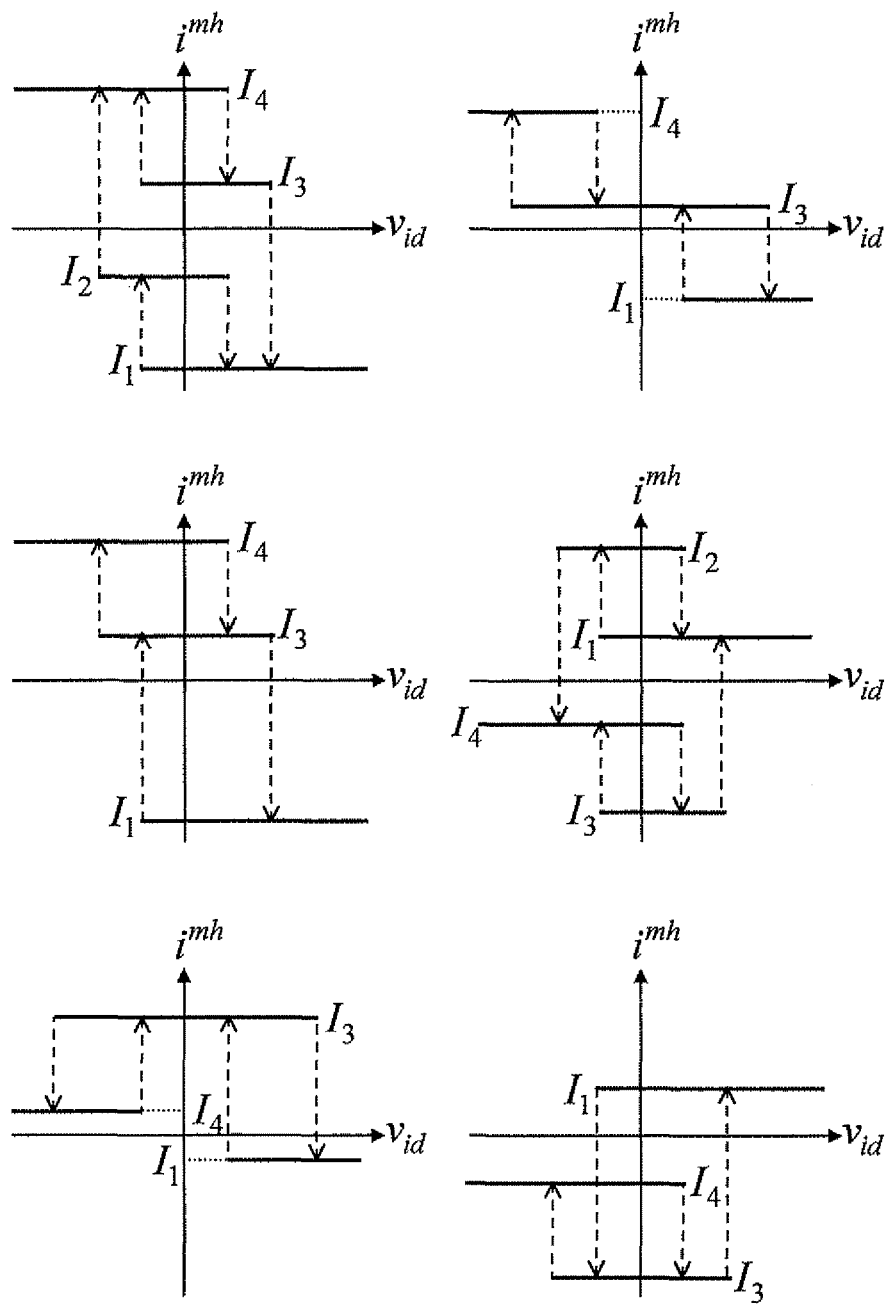
FIG. 4 shows examples of multi-hysteresis VCCS characteristics of the multi-hysteresis VCCS circuit in the multi-screw chaotic oscillator circuit of the present invention.

FIG. 1 shows a diagram of a multi-screw chaotic oscillator circuit of the present invention, and FIG. 2 shows a characteristic of linear VCCS circuits $G_1$ and $G_2$ in the multi-screw chaotic oscillator circuit, wherein FIG. 2(a) shows a circuit symbol of the linear VCCS circuit, and FIG. 2(b) shows its input and output characteristics. FIG. 3 shows a circuit symbol of multi-hysteresis VCCS circuits $MH_1$ and $MH_2$ in the multi-screw chaotic oscillator circuit of the present invention, and FIG. 4 shows examples of multi-hysteresis VCCS characteristics thereof.

As shown in these figures, the multi-screw chaotic oscillator circuit of the present invention is constituted by a linear two-port VCCS circuit 1 consisting of a set of the linear VCCS circuits $G_1$ and $G_2$, a multi-hysteresis two-port VCCS circuit 2 consisting of a set of the multi-hysteresis VCCS circuits $MH_1$ and $MH_2$ having multi-hysteresis characteristic, and two capacitors $C_1$ and $C_2$.

The characteristic of the linear VCCS circuits $G_1$ and $G_2$ is as shown in FIG. 2, wherein transconductance at the central linear sections of their input and output characteristics are identified as $g_{m1}$ and $g_{m2}$, respectively.

On the other hand, the multi-hysteresis VCCS circuits $MH_1$ and $MH_2$ are constituted in accordance with the method of Patent Document 1 above, for example. FIGS. 3 and 4 show the circuit symbol and an example of the multi-hysteresis VCCS characteristic thereof, respectively.

Assuming voltages of the capacitors $C_1$ and $C_2$ as $v_1(t)$ and $v_2(t)$ and currents flowing from the capacitors $C_1$, $C_2$ to the linear two-port VCCS circuit 1 in FIG. 1 as $i_1(t)$, $i_2(t)$, respectively, the circuit equation of a section of the linear two-port VCCS circuit 1 is given as the following equation (1).

[Formula 1]

$$\begin{cases} i_1(t) = -g_{m2}(v_1(t) - v_2(t)) \\ i_2(t) = -g_{m1}(v_1(t)) \end{cases} \quad (1)$$

On the other hand, assuming currents flowing from the capacitors $C_1$, $C_2$ to the multi-hysteresis two-port VCCS circuit 2 as $i'_1(t)$, $i'_2(t)$, respectively, the circuit equation of a section of the multi-hysteresis two-port VCCS circuit 2 in FIG. 1 is given as the following equation (2).

[Formula 2]

$$\begin{cases} i'_1(t) = -MH_2(v_1(t) - v_2(t)) \\ i'_2(t) = -MH_1(v_1(t)) \end{cases} \quad (2)$$

$MH_i(.)$ (i=1, 2) represents a function that provides the multi-hysteresis VCCS characteristic as exemplarily shown in FIG. 4.

The linear two-port VCCS circuit 1 represented by the equation (1) above and the multi-hysteresis two-port VCCS circuit 2 represented by the equation (2) above connected in parallel to configure a circuit, which also has the capacitors $C_1$, $C_2$ connected to each end of the circuit, constitute the multi-screw chaotic oscillator circuit of the present invention as shown in FIG. 1, and the circuit equation of the overall circuit can be represented as follows.

[Formula 3]

$$\frac{d}{dt}\begin{bmatrix} C_1(v_1(t)) \\ C_2(v_2(t)) \end{bmatrix} = \begin{bmatrix} g_{m2} & -g_{m2} \\ g_{m1} & 0 \end{bmatrix}\begin{bmatrix} v_1(t) \\ v_2(t) \end{bmatrix} + \begin{bmatrix} MH_2(v_1(t) - v_2(t)) \\ MH_1(v_1(t)) \end{bmatrix} \quad (3)$$

In order to analyze the operation of the multi-screw chaotic oscillator circuit of the present invention, normalization using the following transformation of variables is performed for the circuit equation above.

$$E_x x(t) = v_1(t) \quad (4)$$

$$E_y y(t) = v_1(t) - v_2(t) \quad (5)$$

$$C_1 E_x \tau = g_{m2} E_y t \quad (6)$$

$$2\delta = E_x / E_y \quad (7)$$

$$\nu = C_1 g_{m1} / C_2 g_{m2} \quad (8)$$

$$\omega = \delta \sqrt{(4\nu - 1)} \quad (9)$$

$$p \cdot mh_1(x(\tau)) = -(1/g_{m1}E_x)MH_1(E_x x(\tau)) \quad (10)$$

$$q \cdot mh_2(y(\tau)) = -(1/g_{m2}E_y)MH_2(E_y y(\tau)) \quad (11)$$

τ represents a normalized time, $x(\tau)$ and $y(\tau)$ represent state variables, δ represents an attenuation parameter, ω represents a vibrational angular frequency parameter, and p and q represent equilibrium point parameters. In addition, $mh_i(.)$ (i=1, 2) is a normalized multi-hysteresis VCCS characteristic.

Figure 5:
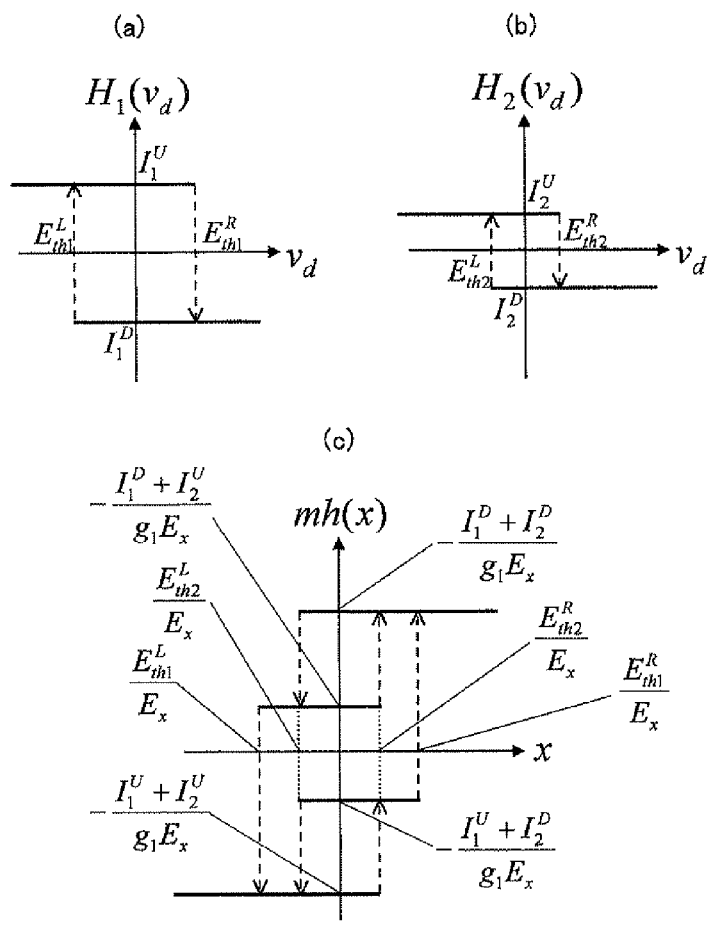
FIG. 5 shows examples of normalization of the multi-hysteresis VCCS characteristics according to the present invention.

FIG. 5 shows an example of the normalization of the multi-hysteresis VCCS characteristic according to the present invention.

For example, the normalization of the multi-hysteresis VCCS characteristic obtained by combining two single-hysteresis VCCS characteristics $H_1(v_d)$, $H_2(v_d)$ shown in FIGS. 5(a) and (b), respectively, results in a multi-hysteresis VCCS characteristic $mh(x(\tau))$ as shown in FIG. 5(c).

By using the transformation of variables and the parameters as described above, the circuit equation (3) above can be normalized as described by the following equation (12).

[Formula 4]

$$\frac{d}{dt}\begin{bmatrix} x(\tau) \\ y(\tau) \end{bmatrix} = \begin{bmatrix} 0 & 1 \\ -4v\delta^2 & 2\delta \end{bmatrix}\begin{bmatrix} x(\tau) - p \cdot mh_1(x(\tau)) \\ y(\tau) - q \cdot mh_2(y(\tau)) \end{bmatrix} \quad (12)$$

As for $p \cdot mh_1(x(\tau))$ and $q \cdot mh_2(y(\tau))$ in the equation (12), the outputs of the multi-hysteresis VCCS characteristics $mh_1(x(\tau))$ and $mh_2(y(\tau))$ switch in accordance with the inputs to provide constants corresponding to each level of discrete outputs of the multi-hysteresis VCCS characteristic, so that the equation (12) above can be considered as the linear differential equation within such an interval. That is, this system can be considered as a piecewise linear system formed by combining half spaces defined by the output of the multi-hysteresis VCCS characteristic $mh_i(.)$. Therefore, by performing transformation of variables as:

[Formula 5]

$$\begin{cases} \tilde{x}(\tau) = x(\tau) - p \cdot mh_1(x(\tau)) \\ \tilde{y}(\tau) = y(\tau) - q \cdot mh_2(y(\tau)) \end{cases} \quad (13)$$

the equation (12) above can be represented by:

[Formula 6]

$$\frac{d}{dt}\begin{bmatrix} \tilde{x}(\tau) \\ \tilde{y}(\tau) \end{bmatrix} = \begin{bmatrix} 0 & 1 \\ -4v\delta^2 & 2\delta \end{bmatrix}\begin{bmatrix} \tilde{x}(\tau) \\ \tilde{y}(\tau) \end{bmatrix} \quad (14)$$

An eigenvalue $\lambda$ of the characteristic equation (14) above is given by:

$$\lambda = \delta +/- \delta\sqrt{(1-4v)} \quad (15)$$

If the parameter $v$ satisfies:

$$4v - 1 > 0 \quad (16)$$

the eigenvalue $\lambda$ would be a complex number and the solution of the equation (14) above would be:

[Formula 7]

$$\begin{bmatrix} \tilde{x}(\tau) \\ \tilde{y}(\tau) \end{bmatrix} = \begin{bmatrix} e^{\delta\tau}\left(\tilde{x}(0)\cos\omega\tau + \frac{1}{\omega}(\tilde{y}(0) - \delta\tilde{x}(0))\sin\omega\tau\right) \\ e^{\delta\tau}\left(\tilde{y}(0)\cos\omega\tau + \frac{\delta}{\omega}(\tilde{y}(0) - 4v\delta\tilde{x}(0))\sin\omega\tau\right) \end{bmatrix} \quad (17)$$

Here, $\tilde{x}(0)$ and $\tilde{y}(0)$ are initial values of $\tilde{x}(\tau)$ and $\tilde{y}(\tau)$, respectively, and $\omega = \delta\sqrt{(4v-1)}$.

In addition, the equation (17) can be represented as:

[Formula 8]

$$\begin{bmatrix} \tilde{x}(\tau) \\ \tilde{y}(\tau) \end{bmatrix} = e^{\delta\tau}\begin{bmatrix} \cos\omega\tau - \frac{\delta}{\omega}\sin\omega\tau & \frac{1}{\omega}\sin\omega\tau \\ -\frac{\delta^2+\omega^2}{\omega}\sin\omega\tau & \cos\omega\tau + \frac{\delta}{\omega}\sin\omega\tau \end{bmatrix}\begin{bmatrix} \tilde{x}(0) \\ \tilde{y}(0) \end{bmatrix} \quad (18)$$

Here, considering that $\delta > 0$, the equation (18) above represents that the solution extends from the initial value ($\tilde{x}(0)$, $\tilde{y}(0)$) at the rate of $e^{\delta\tau}$ while rotating about the origin with the angular frequency $\omega$. Although a solution trajectory diverges in the course, the output switches by reaching each threshold of the multi-hysteresis VCCS characteristic, resulting in the switching to the solution trajectory in the half space defined by the output. As a result, the solution trajectory does not diverge under certain parameter conditions, but presents the chaotic attractor. Here, the parameters $\delta$ and $\omega$ for characterizing the attractor are controllable.

Next, the bifurcation analysis and the attractor will be described.

Here, there is described the possibility of the multi-screw chaotic oscillator circuit of the present invention to have diverse bifurcation phenomena and a variety of chaotic attractors through the bifurcation analysis incorporating symbolic dynamics. As an example, for simplicity, the case will be explained where each $MH_1$ and $MH_2$ is constituted by the multi-hysteresis VCCS circuit having a symmetrical multi-hysteresis VCCS characteristic as shown in FIG. 5(c) that satisfies $E^L_{th1} = -E^R_{Th1}$, $I^D_1 = -I^U_1$, $E^L_{th2} = -E^R_{Th2}$, and $I^D_2 = -I^U_2$. Moreover, the case is discussed where, in the multi-hysteresis two-port VCCS circuit constituted by a set of these two multi-hysteresis VCCS circuits $MH_1$ and $MH_2$, the normalized parameters satisfy $\delta = 0.05$, $\omega = 1.00$, $p = 0.25$, and $q = 0.25$. At this time, the multi-screw chaotic oscillator circuit of the present invention presents various attractors by changing the thresholds of the multi-hysteresis VCCS circuits $MH_1$ and $MH_2$.

In order to characterize these attractors, it is noted that the output currents of the multi-hysteresis VCCS circuits $MH_1$, $MH_2$ take discrete values corresponding to a saturation current in each hysteresis characteristic. That is, the multi-screw chaotic oscillator circuit of the present invention is a type of hybrid system, having continuous internal state variables and corresponding discrete output variables. Then, a discrete series of the output current of the multi-hysteresis VCCS circuit on the trajectory of each attractor is taken into account as the symbol dynamics. Since the circuit exemplified here constitutes the multi-hysteresis two-port VCCS characteristic by using a set of two multi-hysteresis VCCS circuits, that is a combination of two single-hysteresis VCCS circuits, four discrete output states are present for each $mh_1(x(\tau))$, $mh_2(y(\tau))$. As such, there are 4×4=16 combinations of these discrete output states, and corresponding 16 half spaces are present in a solution space. Then, the attractors are classified based on which half space among them the solution trajectory passes through. For this purpose, four discrete output states of $mh_1(x(\tau))$ are labeled as l, which is numbered with l=1, 2, 3, 4. Similarly, the discrete output states of $mh_2(y(\tau))$ are labeled as m, which is numbered with m=1, 2, 3, 4. Moreover, a solution space S is represented using l, m as:

[Formula 9]

$$S = [s_{lm}] = \begin{bmatrix} s_{11} & s_{12} & s_{13} & s_{14} \\ s_{21} & s_{22} & s_{23} & s_{24} \\ s_{31} & s_{32} & s_{33} & s_{34} \\ s_{41} & s_{42} & s_{43} & s_{44} \end{bmatrix} \quad (19)$$

where $s_{lm}$ is a half space constituted by the discrete output values l and m.

Here, the attractors are classified by describing them with a binary variable, $b_{lm}$="1", if the trajectory of the attractor passes through the half space $s_{lm}$, while describing them with $b_{lm}$="0" if not. A trajectory passing half space matrix as described in this manner is denoted as B. For example, the attractor represented by:

[Formula 10]

$$B = \begin{bmatrix} 1 & 0 & 1 & 1 \\ 0 & 1 & 0 & 0 \\ 0 & 1 & 0 & 1 \\ 0 & 1 & 1 & 1 \end{bmatrix} \quad (20)$$

indicates that the trajectory thereof passes through half spaces $s_{11}$, $s_{13}$, $s_{14}$, $s_{22}$, $s_{32}$, $s_{34}$, $s_{42}$, $s_{43}$, and $s_{44}$.

Figure 6:
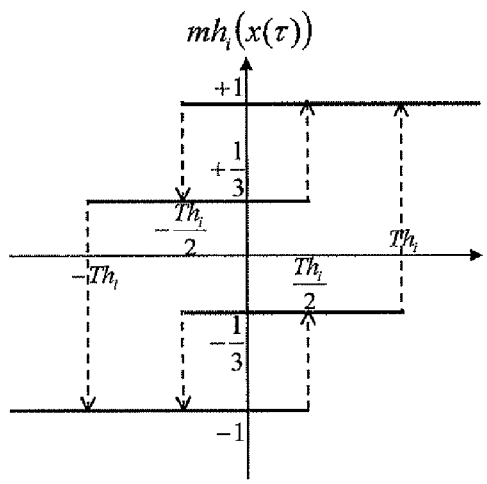
FIG. 6 shows a first example of a normalized characteristic (i=1, 2) of two sets of multi-hysteresis VCCS circuits constituting a multi-hysteresis two-port VCCS characteristic in a configuration example of the multi-screw chaotic oscillator circuit of the present invention.
Figure 7:
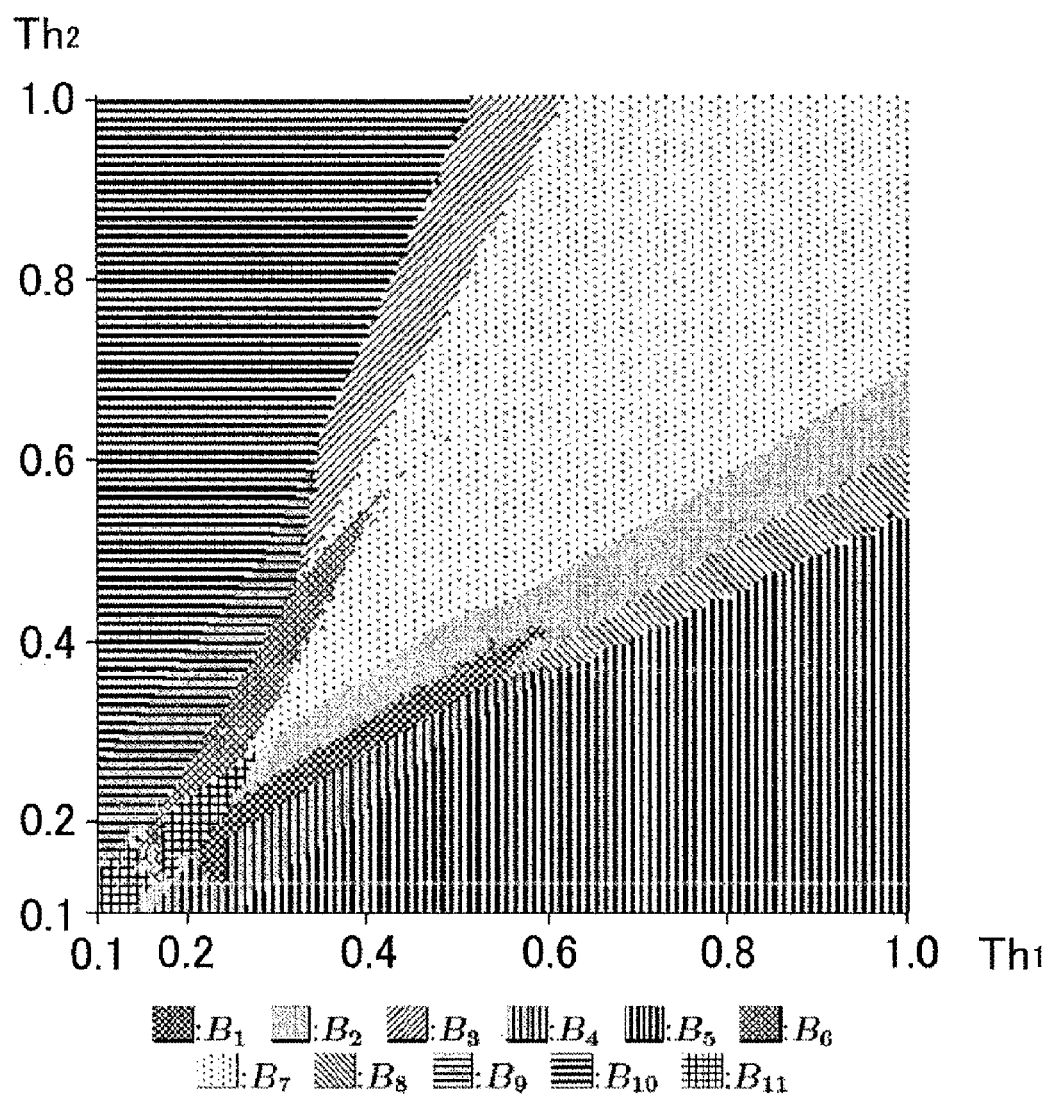
FIG. 7 shows a two-parameter bifurcation diagram of the multi-screw chaotic oscillator circuit when thresholds $Th_1$ (horizontal axis) and $Th_2$ (vertical axis) of the multi-hysteresis VCCS circuit having the normalized characteristic shown in FIG. 6 are used as bifurcation parameters.

First, assuming that both of two multi-hysteresis VCCS circuits constituting the multi-hysteresis two-port VCCS characteristic have the normalized multi-hysteresis VCCS characteristic as shown in FIG. 6, the half space through which the solution trajectory passes was checked for the attractors obtained by changing the thresholds $Th_1$ and $Th_2$ of the respective circuits from 0.1 through 1.0. FIG. 7 shows a two-parameter bifurcation diagram obtained therefrom. In FIG. 7, there are 11 trajectory passing half space matrices each representing the half space through which the trajectory of each attractor passes as:

[Formula 11]

$$B_1 = \begin{bmatrix} 0 & 0 & 0 & 0 \\ 0 & 0 & 0 & 1 \\ 0 & 0 & 0 & 0 \\ 0 & 1 & 0 & 1 \end{bmatrix} \; B_2 = \begin{bmatrix} 0 & 0 & 0 & 0 \\ 0 & 1 & 0 & 1 \\ 0 & 0 & 0 & 0 \\ 0 & 1 & 0 & 1 \end{bmatrix} \; B_3 = \begin{bmatrix} 0 & 0 & 0 & 1 \\ 0 & 1 & 0 & 1 \\ 0 & 0 & 0 & 1 \\ 0 & 1 & 0 & 1 \end{bmatrix} \quad (21)$$

$$B_4 = \begin{bmatrix} 0 & 0 & 0 & 1 \\ 0 & 0 & 0 & 1 \\ 0 & 0 & 0 & 1 \\ 0 & 1 & 0 & 1 \end{bmatrix} \; B_5 = \begin{bmatrix} 0 & 0 & 0 & 1 \\ 0 & 0 & 0 & 1 \\ 0 & 0 & 0 & 1 \\ 0 & 0 & 0 & 1 \end{bmatrix} \; B_6 = \begin{bmatrix} 0 & 1 & 0 & 1 \\ 0 & 0 & 0 & 0 \\ 0 & 0 & 0 & 1 \\ 0 & 0 & 0 & 0 \end{bmatrix}$$

$$B_7 = \begin{bmatrix} 0 & 1 & 0 & 1 \\ 0 & 0 & 0 & 0 \\ 0 & 1 & 0 & 1 \\ 0 & 0 & 0 & 0 \end{bmatrix} \; B_8 = \begin{bmatrix} 1 & 1 & 1 & 1 \\ 0 & 0 & 0 & 0 \\ 0 & 1 & 0 & 1 \\ 0 & 0 & 0 & 0 \end{bmatrix} \; B_9 = \begin{bmatrix} 1 & 1 & 1 & 1 \\ 0 & 0 & 0 & 0 \\ 0 & 0 & 0 & 1 \\ 0 & 0 & 0 & 0 \end{bmatrix}$$

$$B_{10} = \begin{bmatrix} 1 & 1 & 1 & 1 \\ 0 & 0 & 0 & 0 \\ 0 & 0 & 0 & 0 \\ 0 & 0 & 0 & 0 \end{bmatrix} \; B_{11} = \begin{bmatrix} 1 & 1 & 1 & 1 \\ 1 & 0 & 0 & 1 \\ 1 & 0 & 0 & 1 \\ 1 & 1 & 1 & 1 \end{bmatrix}$$

Moreover, FIG. 8 shows several examples of typical chaotic attractors in this bifurcation diagram. In this figure, FIG. 8(*a*) shows an example of the chaotic attractor in a domain $B_{10}$ ($Th_1$=0.20, $Th_2$=0.60) in FIG. 7, FIG. 8(*b*) shows an example of the chaotic attractor in a domain $B_5$ ($Th_1$=0.60, $Th_2$=0.20) in FIG. 7, FIG. 8(*c*) shows an example of the chaotic attractor in a domain $B_{11}$ ($Th_1$=0.20, $Th_2$=0.20) in FIG. 7, and FIG. 8(*d*) shows an example of the chaotic attractor in a domain $B_7$ ($Th_1$=0.60, $Th_2$=0.60) in FIG. 7.

Figure 9:
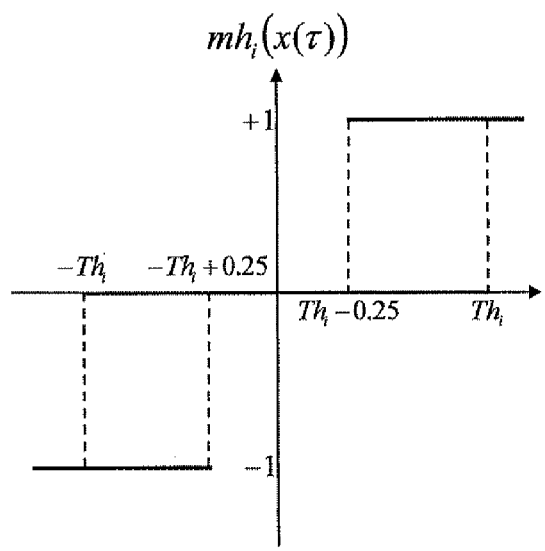
FIG. 9 shows a second example of the normalized characteristic (i=1, 2) of two sets of multi-hysteresis VCCS circuits constituting the multi-hysteresis two-port VCCS characteristic in a configuration example of the multi-screw chaotic oscillator circuit of the present invention.
Figure 10:
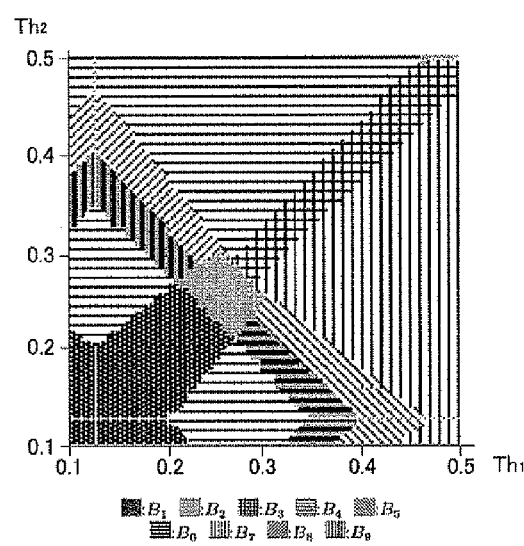
FIG. 10 shows a two-parameter bifurcation diagram of the multi-screw chaotic oscillator circuit when the thresholds $Th_1$ (horizontal axis) and $Th_2$ (vertical axis) of the multi-hysteresis VCCS circuit having the normalized characteristic shown in FIG. 9 are used as bifurcation parameters.

As the next example, assuming that both of two multi-hysteresis VCCS circuits constituting the multi-hysteresis two-port VCCS characteristic have the normalized multi-hysteresis VCCS characteristic as shown in FIG. 9, the half space through which the attractor passes was checked for the attractors obtained by changing the thresholds $Th_1$ and $Th_2$ of the respective circuits from 0.1 through 0.5. FIG. 10 shows a two-parameter bifurcation diagram obtained therefrom. In this case, since the saturation current at the central section of the normalized multi-hysteresis VCCS characteristic that was used (FIG. 9) is degenerated, there are three possible saturation current values of the discrete output. Therefore, the number of half space would be 3×3=9. In FIG. 10, there are nine (3×3) trajectory passing half space matrices each representing the half space through which the trajectory of each attractor passes as:

[Formula 12]

$$B_1 = \begin{bmatrix} 1 & 1 & 1 \\ 1 & 0 & 1 \\ 1 & 1 & 1 \end{bmatrix} \; B_2 = \begin{bmatrix} 1 & 1 & 1 \\ 1 & 1 & 1 \\ 1 & 1 & 1 \end{bmatrix} \; B_3 = \begin{bmatrix} 0 & 1 & 0 \\ 1 & 1 & 1 \\ 0 & 1 & 0 \end{bmatrix} \quad (22)$$

$$B_4 = \begin{bmatrix} 0 & 0 & 0 \\ 1 & 1 & 1 \\ 0 & 0 & 0 \end{bmatrix} \; B_5 = \begin{bmatrix} 1 & 0 & 0 \\ 1 & 1 & 1 \\ 0 & 0 & 1 \end{bmatrix} \; B_6 = \begin{bmatrix} 1 & 1 & 1 \\ 0 & 1 & 0 \\ 1 & 1 & 1 \end{bmatrix}$$

$$B_7 = \begin{bmatrix} 0 & 1 & 0 \\ 0 & 1 & 0 \\ 0 & 1 & 0 \end{bmatrix} \; B_8 = \begin{bmatrix} 0 & 1 & 1 \\ 0 & 1 & 0 \\ 1 & 1 & 0 \end{bmatrix} \; B_9 = \begin{bmatrix} 1 & 0 & 1 \\ 1 & 1 & 1 \\ 1 & 0 & 1 \end{bmatrix}$$

Figure 11:
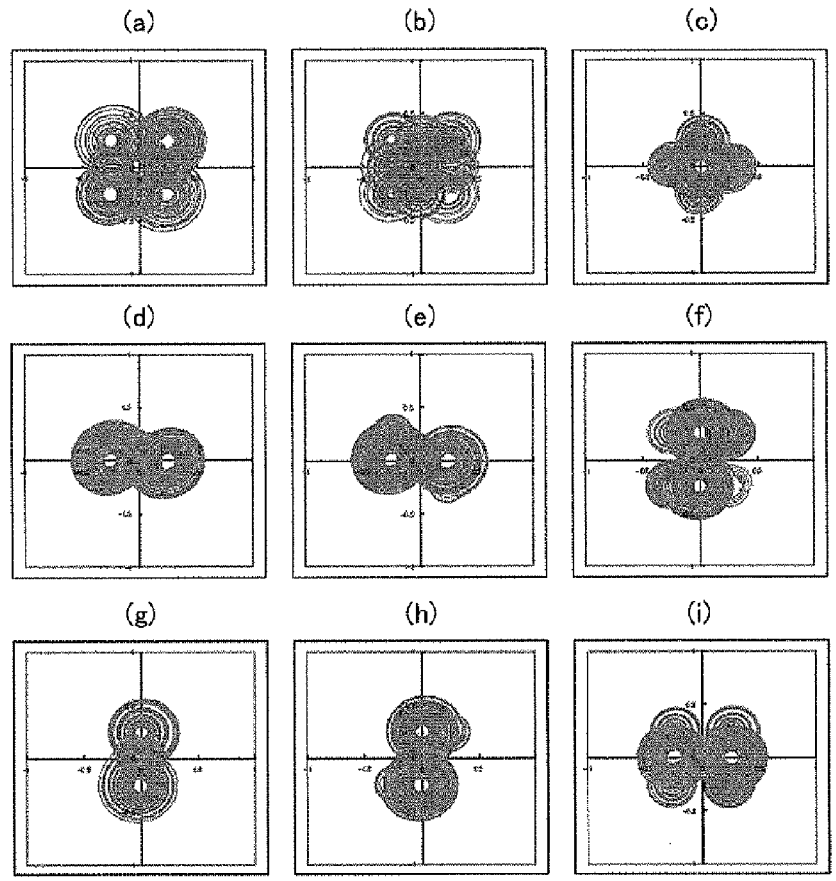
FIG. 11 shows examples of the chaotic attractors of the multi-screw chaotic oscillator circuit obtained by changing the thresholds $Th_1$ and $Th_2$ when the normalized multi-hysteresis VCCS characteristic shown in FIG. 9 is used.

FIG. 11 shows several examples of typical chaotic attractors in this bifurcation diagram. In FIG. 11, FIG. 11(*a*) shows an example of the chaotic attractor in a domain $B_1$ ($Th_1$=0.20, $Th_2$=0.20) in FIG. 10, FIG. 11(*b*) shows an example of the chaotic attractor in a domain $B_2$ ($Th_1$=0.25, $Th_2$=0.25) in FIG. 10, FIG. 11(*c*) shows an example of the chaotic attractor in a domain $B_3$ ($Th_1$=0.30, $Th_2$=0.30) in FIG. 10, FIG. 11(*d*) shows an example of the chaotic attractor in a domain $B_4$ ($Th_1$=0.20, $Th_2$=0.40) in FIG. 10, FIG. 11(*e*) shows an example of the chaotic attractor in a domain $B_5$ ($Th_1$=0.20, $Th_2$=0.35) in FIG. 10, FIG. 11(*f*) shows an example of the chaotic attractor in a domain $B_6$ ($Th_1$=0.30, $Th_2$=0.20) in FIG. 10, FIG. 11(*g*) shows an example of the chaotic attractor in a domain $B_7$ ($Th_1$=0.40, $Th_2$=0.20) in FIG. 10, FIG. 11(*h*) shows an example of the chaotic attractor in a domain $B_8$ ($Th_1$=0.35, $Th_2$=0.20) in FIG. 10, and FIG. 11(*i*) shows an example of the chaotic attractor in a domain $B_9$ ($Th_1$=0.20, $Th_2$=0.30) in FIG. 10. These chaotic attractors differ from those observed until now.

As described in the examples above, according to the multi-screw chaotic oscillator circuit of the present invention, a variety of chaotic attractors can also be obtained only by controlling the thresholds of the multi-hysteresis VCCS circuit constituting the multi-hysteresis two-port VCCS characteristic. Therefore, it is considered that changing the circuit parameters other than the thresholds allows more diverse bifurcation phenomena or chaotic attractors to be obtained. Moreover, as illustrated above, the chaotic attractors different from those obtained conventionally have been observed in the multi-screw chaotic oscillator circuit of the present invention. In addition, the bifurcation phenomena producing these chaotic attractors are very complex, and such bifurcation phenomena themselves are likely to have unique bifurcation structures.

Next, the implementation of the multi-screw chaotic oscillator circuit will be described.

In order to show the availability of the present invention, the fully-differential hysteresis two-port VCCS chaotic oscillator circuit of Non-Patent Documents 17-19 above was extended. The fully-differential multi-screw chaotic oscillator circuit will be described below. This circuit was designed with the TSMC 0.35 μm CMOS semiconductor process.

Figure 12:
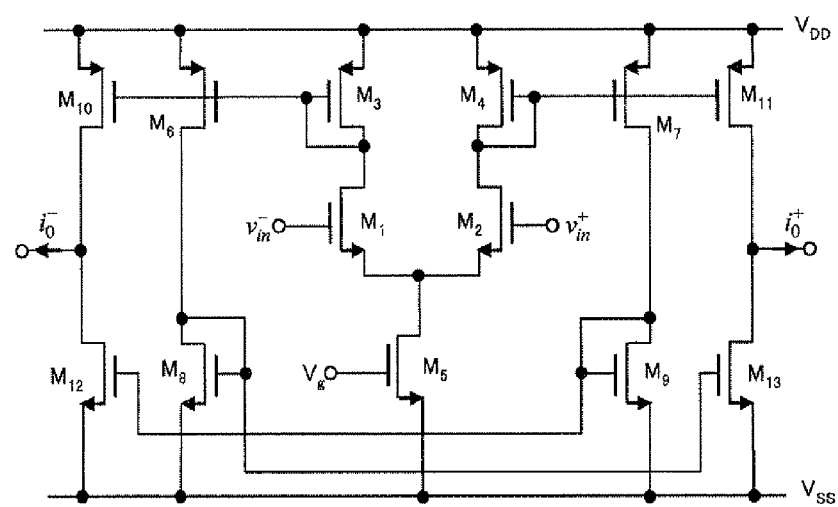
FIG. 12 shows a diagram of a fully-differential linear VCCS circuit used as the linear VCCS circuits $G_1$ and $G_2$ constituting a linear two-port VCCS circuit in the configuration example of the multi-screw chaotic oscillator circuit of the present invention.

As for two linear VCCS circuits $G_1$ and $G_2$ constituting the linear two-port VCCS circuit in the multi-screw chaotic oscillator circuit of the present invention, the fully-differential linear VCCS circuit proposed in Non-Patent Document 19 was used. The circuit is shown in FIG. 12. In this circuit, the value of transconductance $g_m$ at the central linear section of input and output characteristics can be changed by changing an external control voltage $V_g$. Table 1 shows the sizes of each MOSFET, used in the simulation experiment, of the fully-differential VCCS circuit.

TABLE 1

| Elements | W/L | Elements | W/L |
|---|---|---|---|
| $M_{1,2}$ | 1 μm/2 μm | $M_{3,4}$ | 1.1 μm/2 μm |
| $M_5$ | 4.4 μm/2 μm | $M_{6,7}$ | 2.15 μm/2 μm |
| $M_{8,9}$ | 0.8 μm/2 μm | $M_{10,11}$ | 2.2 μm/2 μm |
| $M_{12,13}$ | 0.8 μm/2 μm | | |

Figure 13:
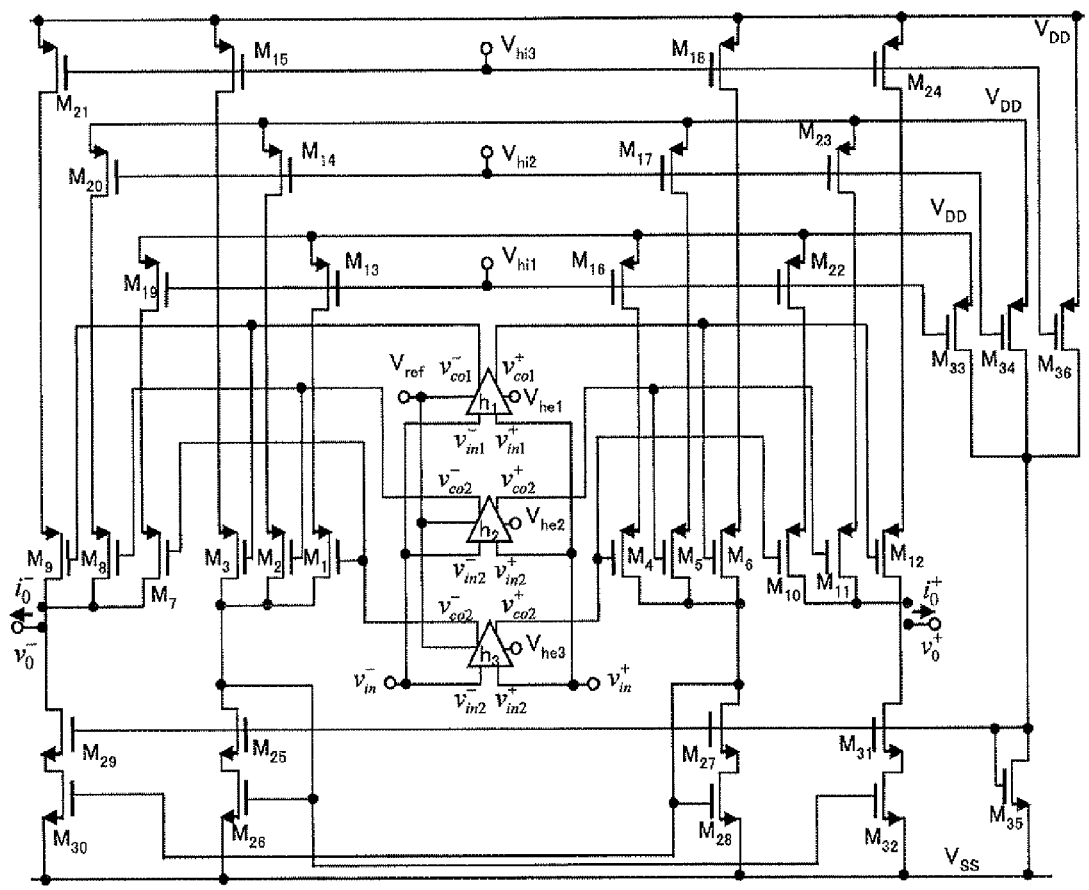
FIG. 13 shows a diagram of a fully-differential multi-hysteresis VCCS circuit used as the multi-hysteresis VCCS circuits $MH_1$ and $MH_2$ constituting the multi-hysteresis two-port VCCS circuit in the configuration example of the multi-screw chaotic oscillator circuit of the present invention.
Figure 14:
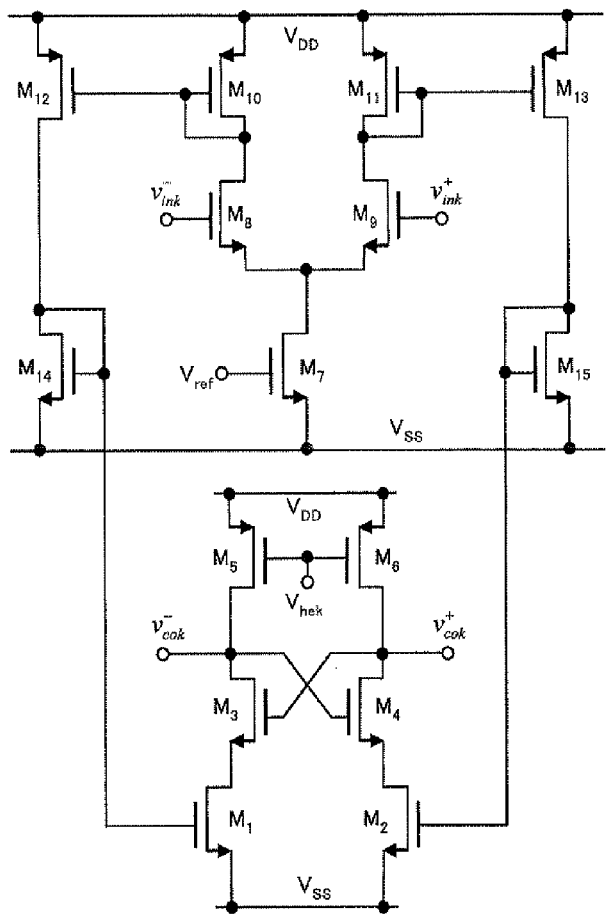
FIG. 14 shows a core circuit having a single-hysteresis VCCS characteristic, illustrated by the triangular symbols in FIG. 13.

On the other hand, the multi-hysteresis VCCS circuits $MH_1$ and $MH_2$ constituting the multi-hysteresis two-port VCCS circuit in the multi-screw chaotic oscillator circuit shown in FIG. 1 was implemented in accordance with the method proposed in Patent Document 1 above. FIG. 13 shows a specific circuit. In FIG. 13, triangular symbols $h_1$, $h_2$, and $h_3$ represent core circuits having single-hysteresis VCCS characteristic, as shown in FIG. 14. Threshold voltages of the multi-hysteresis VCCS characteristic can be changed by adjusting the external control voltages $V_{hek}$ of the core circuit. Moreover, in order to implement the multi-hysteresis VCCS circuits $MH_1$ and $MH_2$ in the fully-differential multi-hysteresis VCCS circuit in FIG. 13, the MOSFETs having the sizes shown in Table 2 were used. Furthermore, in order to implement the multi-hysteresis VCCS circuits $MH_1$ and $MH_2$, the sizes of the MOSFETs in the core circuit shown in FIG. 14 took the values shown in Tables 3 and 4, respectively.

TABLE 2

| Elements | W/L | Elements | W/L |
|---|---|---|---|
| $M_{1,2,3,4,5,6}$ | 3.2 μm/1.0 μm | $M_{7,8,9,10,11,12}$ | 3.2 μm/1.0 μm |
| $M_{13,14,15}$ | 8.0 μm/2.0 μm | $M_{16,17,18}$ | 8.0 μm/2.0 μm |
| $M_{19,20,21}$ | 16.0 μm/2.0 μm | $M_{22,23,24}$ | 16.0 μm/2.0 μm |
| $M_{25,27}$ | 1.6 μm/1.0 μm | $M_{26,28}$ | 3.6 μm/2.0 μm |
| $M_{29,31}$ | 3.2 μm/1.0 μm | $M_{30,32}$ | 7.2 μm/2.0 μm |
| $M_{33,34,36}$ | 3.6 μm/1.0 μm | $M_{35}$ | 1.0 μm/3.5 μm |

TABLE 3

| Elements | W/L | Elements | W/L |
|---|---|---|---|
| $M_{1,2}$ | 1.0 μm/2.0 μm | $M_{3,4}$ | 2.0 μm/1.0 μm |
| $M_5$ | 5.0 μm/1.0 μm | $M_7$ | 4.4 μm/2.0 μm |

TABLE 3-continued

| Elements | W/L | Elements | W/L |
|---|---|---|---|
| $M_{8,9}$ | 1.0 μm/2.0 μm | $M_{10,11}$ | 2.2 μm/2.0 μm |
| $M_{12,13}$ | 2.15 μm/2.0 μm | $M_{14,15}$ | 0.8 μm/2.0 μm |

TABLE 4

| Elements | W/L | Elements | W/L |
|---|---|---|---|
| $M_{1,2}$ | 1.2 μm/2.0 μm | $M_{3,4}$ | 4.0 μm/1.0 μm |
| $M_{5,6}$ | 13.0 μm/1.0 μm | $M_7$ | 4.4 μm/2.0 μm |
| $M_{8,9}$ | 1.0 μm/2.0 μm | $M_{10,11}$ | 2.2 μm/2.0 μm |
| $M_{12,13}$ | 2.15 μm/2.0 μm | $M_{14,15}$ | 0.8 μm/2.0 μm |

In addition, the capacities of the capacitors $C_1$, $C_2$ in the multi-screw chaotic oscillator circuit shown in FIG. 1 were 40 pF and 10 pF, respectively.

Figure 15:
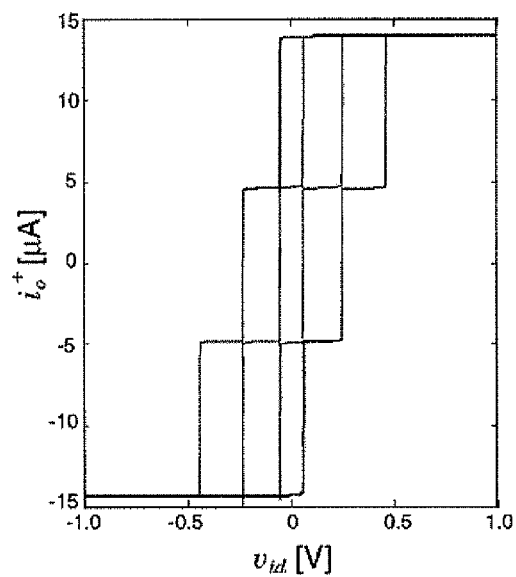
FIG. 15 shows a characteristic of the multi-hysteresis VCCS circuit $MH_2$ used in the SPICE simulation.
Figure 16:
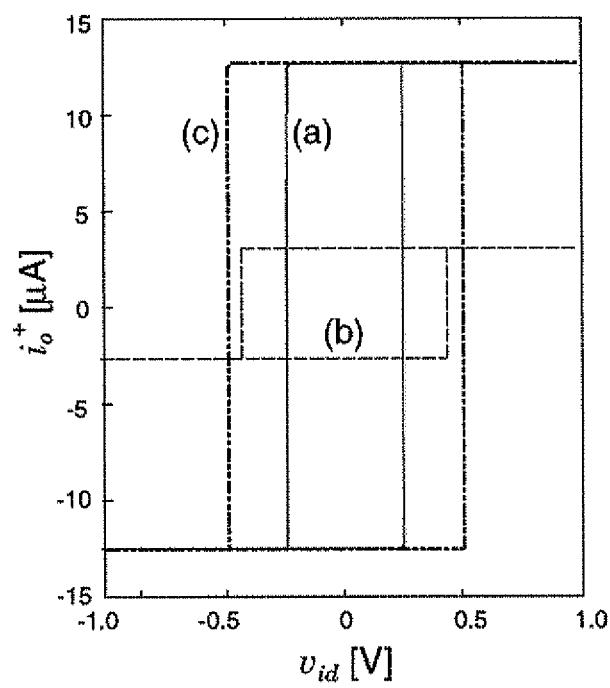
FIG. 16 shows characteristics (a), (b), and (c) of the multi-hysteresis VCCS circuit $MH_1$ used in the SPICE simulation.
Figure 19:
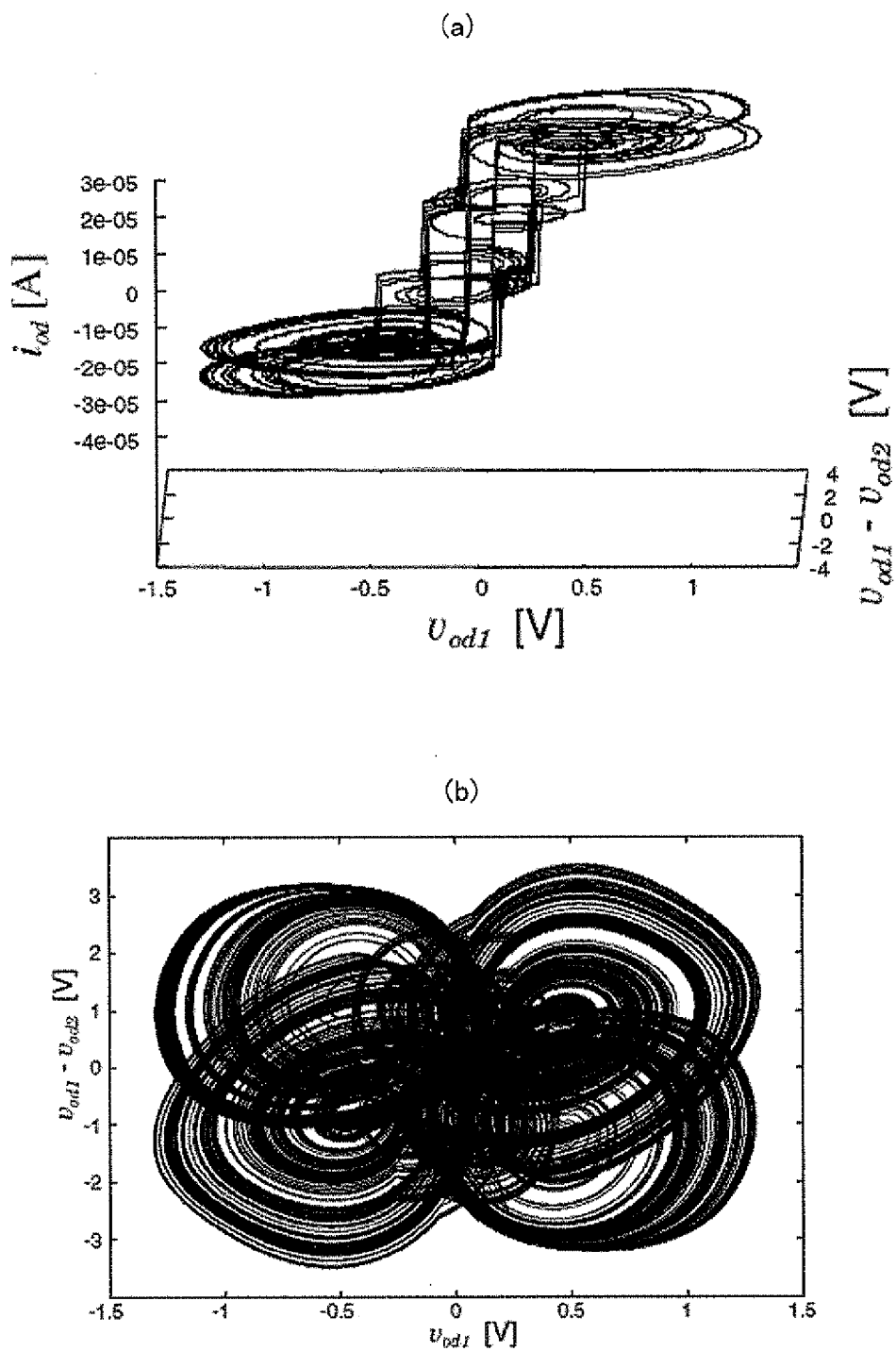
FIGS. 19(a) and 19(b), show the chaotic attractor obtained when the characteristic (c) shown in FIG. 16 is used as the characteristic of the multi-hysteresis VCCS circuit $MH_1$.

The fully-differential multi-screw chaotic oscillator circuit was constituted by connecting the circuit elements described above as shown in FIG. 1, and its chaotic attractors were observed in the SPICE simulation. In this regard, the characteristic of the multi-hysteresis VCCS circuit $MH_2$ was fixed to the multi-hysteresis VCCS characteristic as shown in FIG. 15, while the hysteresis VCCS characteristic of the multi-hysteresis VCCS circuit $MH_1$ was changed among FIG. 16(a), (b), and (c). FIG. 17 shows the chaotic attractor obtained when using the characteristic of FIG. 16(a) as the characteristic of the multi-hysteresis VCCS circuit $MH_1$, FIG. 18 shows the chaotic attractor obtained when using the characteristic of FIG. 16(b), and FIG. 19 shows the chaotic attractor obtained when using the characteristic of FIG. 16(c). Here, FIGS. 17(a), 18(a), and 19(a) each shows the attractor in a phase space $v_{od1}$-$(v_{od1}-v_{od2})$-$i_{od}$, while FIGS. 17(b), 18(b), and 19(b) each shows a projection onto a plane $V_{od1}$-$(v_{od1}-v_{od2})$. In these figures, $v_{od1}$ and $v_{od2}$ represent differential voltages corresponding to $v_1(t)$ and $v_2(t)$ in FIG. 1, respectively, and $i_{od}$ represents a differential current corresponding to $i_1(t)+i'_1(t)$ in FIG. 1. Table 5 shows the values of the external control voltage when these attractors were observed.

TABLE 5

| Elemental circuit | Control voltage | FIG. 17 | FIG. 18 | FIG. 19 |
|---|---|---|---|---|
| $MH_1$ | $V_{he1}, V_{he2}, V_{he3}$ | 1.08 V | 1.15 V | 1.17 V |
| | $V_{ref}$ | −1.25 V | −1.25 V | −1.25 V |
| | $V_{hi}$ | 1.28 V | 1.40 V | 1.28 V |
| $MH_2$ | $V_{he1}$ | 1.20 V | 1.20 V | 1.20 V |
| | $V_{he2}$ | 1.24 V | 1.24 V | 1.24 V |
| | $V_{he3}$ | 1.29 V | 1.29 V | 1.29 V |
| | $V_{ref}$ | −1.25 V | −1.25 V | −1.25 V |
| | $V_{hi}$ | 1.27 V | 1.27 V | 1.27 V |
| $G_1$ | $V_g$ | −1.15 V | −1.15 V | −1.15 V |
| $G_2$ | $V_g$ | −1.09 V | −1.09 V | −1.09 V |

$V_{he1}, V_{he2}, V_{he3}$, and $V_{hi}$ shown in Table 5 are parameters for controlling width and height of the hysteresis of the multi-hysteresis VCCS circuits $MH_S$, and $MH_2$. $V_g$ is a parameter for controlling the transconductance $g_m$ at the central linear section of the input and output characteristics of the fully-differential linear VCCS circuit.

From the results shown in FIGS. 17, 18, and 19, it was verified that the circuit configuration according to the present invention can realize a variety of multi-screw attractors.

In the present invention, there is provided the multi-screw chaotic oscillator circuit using the multi-hysteresis VCCS circuit. Since the multi-screw chaotic oscillator circuit does not include an inductor in spite of the fact that it is a continuous-time circuit, the circuit configuration is simpler as compared to the conventionally proposed chaotic circuits. Moreover, since a variety of multi-hysteresis VCCS characteristics can be used, various multi-screw attractors can be generated. Furthermore, by changing different characteristics of the multi-hysteresis VCCS circuit as a component, a greater number of chaotic attractors or bifurcation structures can be realized. That is, the multi-screw chaotic oscillator circuit of the present invention has a number of control parameters such as the thresholds and saturation currents of the multi-hysteresis VCCS circuit, the shapes of the multi-hysteresis VCCS characteristic, and the eigenvalues of the circuit, and thus can produce the conventionally-proposed chaotic attractors as well as various chaotic attractors which have not been disclosed to date by controlling these parameters.

The multi-screw chaotic oscillator circuit of the present invention utilizes its various high-dimensional chaotic attractors and is thus applicable to information processors using chaos.

Moreover, since the multi-screw chaotic oscillator circuit of the present invention is a hybrid dynamical system, it can be utilized in the quick physical simulations of high-dimensional hybrid dynamical systems or in the information processing systems based on high-dimensional hybrid dynamics.

In addition, the multi-screw chaotic oscillator circuit of the present invention is effective in realization of dynamic memories with a large memory capacity and multivalued logic circuits by making the discrete output states of the multi-hysteresis VCCS characteristic to be symbolic dynamics or multivalued logic values.

Furthermore, various high-dimensional chaotic attractors generated by the multi-screw chaotic oscillator circuit of the present invention are useful in generation of complex spatiotemporal patterns, image processing, chaotic communications, chaotic encryption, and the like.

The present invention should not be limited to the embodiments described above, and a number of variations are possible on the basis of the spirit of the present invention. These variations should not be excluded from the scope of the present invention.

INDUSTRIAL APPLICABILITY

The multi-screw chaotic oscillator circuit of the present invention utilizes its various high-dimensional chaotic attractors and is thus applicable to information processors using chaos.

What is claimed is:

1. A multi-screw chaotic oscillator circuit comprising:
    (a) a linear two-port VCCS circuit consisting of a set of linear VCCS circuits $G_1$ and $G_2$;
    (b) a multi-hysteresis two-port VCCS circuit consisting of a set of respective first and second multi-hysteresis VCCS circuits $MH_1$ and $MH_2$ each having a respective hysteresis characteristic; and
    (c) capacitors $C_1$ and $C_2$ connected to each end of a circuit configured by parallel-connecting the linear two-port VCCS circuit and the multi-hysteresis two-port VCCS circuit,
    wherein a variety of chaotic attractors or bifurcation structures are realized by using various different multi-hysteresis VCCS characteristics as the respective hysteresis characteristics of the first and second multi-hysteresis VCCS circuits $MH_1$ and $MH_2$, and
    wherein a greater number of chaotic attractors or bifurcation phenomena are presented by changing different characteristics of the multi-hysteresis VCCS circuits $MH_1$ and $MH_2$.

2. The multi-screw chaotic oscillator circuit according to claim 1, wherein the different characteristics of the multi-hysteresis VCCS circuits $MH_1$ and $MH_2$ are thresholds or saturation currents.

3. The multi-screw chaotic oscillator circuit according to claim 2, wherein the thresholds include a plurality of thresholds having different values from each other.

4. The multi-screw chaotic oscillator circuit according to claim 3, wherein the multi-hysteresis VCCS circuit $MH_1$ has n values of the saturation current, and the multi-hysteresis VCCS circuit $MH_2$ has m values of the saturation current.

5. The multi-screw chaotic oscillator circuit according to claim 4, wherein, when the plurality of thresholds express four values, four discrete outputs are present for each of the multi-hysteresis VCCS circuits $MH_1$ and $MH_2$ and 16 half spaces corresponding to the combinations of each of the four discrete outputs are present in a solution space, so that the chaotic attractors are classified based on which half space among them a solution trajectory passes through.

6. The multi-screw chaotic oscillator circuit according to claim 1, wherein a greater number of chaotic attractors or bifurcation phenomena are presented by changing a plurality of control parameters of the multi-hysteresis VCCS characteristics.

7. The multi-screw chaotic oscillator circuit according to claim 6, wherein the plurality of control parameters include the shapes of the multi-hysteresis VCCS characteristics and eigenvalues of the circuit.

8. The multi-screw chaotic oscillator circuit according to claim 1, wherein, when an attenuation parameter delta is 0.05, vibrational angular frequency parameter omega is 1.00, an equilibrium point parameter p is 0.25, and an equilibrium point parameter q is 0.25 of a normalized parameter for the multi-hysteresis two-port VCCS circuit consisting of the set of multi-hysteresis VCCS circuits $MH_1$ and $MH_2$ having the multi-hysteresis VCCS characteristics, the thresholds of the multi-hysteresis VCCS circuits $MH_1$ and $MH_2$ are changed.

9. The multi-screw chaotic oscillator circuit according to claim 1, wherein capacities of the capacitors $C_1$ and $C_2$ are 40 pF and 10 pF, respectively.

* * * * *